United States Patent
Wright

(10) Patent No.: US 6,414,414 B1
(45) Date of Patent: Jul. 2, 2002

(54) UNIDIRECTIONAL TRANSDUCER ETCHED WITH SURFACE ACOUSTIC WAVES

(75) Inventor: Peter Wright, Biot (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/463,578

(22) PCT Filed: May 28, 1999

(86) PCT No.: PCT/FR99/01265

§ 371 (c)(1),
(2), (4) Date: Jan. 28, 2000

(87) PCT Pub. No.: WO99/63662

PCT Pub. Date: Dec. 9, 1999

(30) Foreign Application Priority Data

May 29, 1998 (FR) .............................................. 98 06834

(51) Int. Cl.⁷ ............................ H03H 9/25; H01L 41/08
(52) U.S. Cl. ................................ 310/313 D; 310/313 R
(58) Field of Search .......................... 310/313 R, 313 D

(56) References Cited

U.S. PATENT DOCUMENTS 5,162,689 A * 11/1992 Fliegel et al. ........... 310/313 B

FOREIGN PATENT DOCUMENTS

| GB | 2 106 346 | * 11/1992 | ............. 310/313 R |
| JP | 2-149114 | * 6/1990 | ............. 310/313 R |
| JP | 4-68607 | * 3/1992 | ............. 310/313 R |
| WO | 8201629 | * 11/1992 | ............. 310/313 D |

OTHER PUBLICATIONS

Hines, et al., "High Frequency SAW Devices", IEEE International Microwave Symposium Digest, pp. 177–180, Jun. 1997.*

* cited by examiner

*Primary Examiner*—Thomas M. Dougherty
(74) *Attorney, Agent, or Firm*—Oblon, Spivak, McClelland, Maier & Neustadt, P.C.

(57) ABSTRACT

A surface acoustic wave transducer in which an etching network is superimposed on the conventional networks of electrodes of acoustic transducers. The superposition of these networks makes it possible to obtain a favored direction of propagation of the acoustic waves while maintaining a high quality factor Q comparable with that of conventional bidirectional transducers. Such a surface acoustic wave transducer may find application in mobile radio communication systems.

15 Claims, 4 Drawing Sheets

UNIDIRECTIONAL TRANSDUCER ETCHED WITH SURFACE ACOUSTIC WAVES

BACKGROUND OF THE INVENTION

1. Field of the Invention

The field of the invention is that of surface acoustic wave transducers and filters including such transducers, used in numerous fields such as mobile radio communication systems for example for intermediate frequency filtering.

2. Discussion of the Background

Various types of high-performance transducers have come out over the last ten years or so.

Unidirectional transducers (Single-Phase Unidirectional Transducers also known as SPUDT) have replaced bidirectional transducers in many applications by virtue of the decrease in losses which they make it possible to obtain. This type of transducer, described in the published U.S. Pat. No. 2,702,899 is made by insetting, into a transducer, so-called transduction cells and so-called reflection cells, and by positioning the cells with respect to one another in such a way that the waves emitted are again in phase with the waves reflected in the useful direction and that phase opposition is obtained in the other direction. This involves a transducer in which electrodes designed so as to achieve the existence of a transduction function and a reflection function are dispersed. It has also been demonstrated in the published U.S. Pat. No. 2,702,899 that it may be advantageous to make resonant cavities inside the SPUDT, a resonant cavity being made by changing the sign of the reflection function.

For the customary substrates, the distance between transduction centre and reflection centre can be of the form $(2n+1)\lambda/8$ with n an integer so that the phases are correct.

However, the quality factor Q relating to the ratio of the capacitance to the conductance of the filter and representative of the bandwidth and insertion loss of the filter is lower for unidirectional filters with their specific architectures into which are introduced asymmetries than that of conventional, symmetric bidirectional filters.

SUMMARY OF THE INVENTION

To increase performance, that is to say to increase the coupling in a unidirectional transducer (without increasing the capacitance), the invention proposes a transducer into which is introduced an etching network superimposed on the conventional networks of electrodes of acoustic transducers. More precisely, the subject of the invention is a surface wave transducer including a substrate on which are deposited two networks of interdigital electrodes and connected to different polarities so as to create acoustic transduction cells defined by at least two consecutive electrodes of different polarities, characterized in that it furthermore comprises at least one network of etchings separated by mesas, the superposition of the networks of electrodes and of the etching network making it possible to obtain a favoured direction of propagation of the acoustic waves.

According to a first variant of the invention, the networks of electrodes are symmetric with respect to an axis situated at the centre of two consecutive electrodes of the same polarity, the network of etchings being asymmetric with respect to the said axis.

In this configuration, the symmetric networks of electrodes make it possible to retain a high coupling factor whilst for its part the asymmetric etching network makes it possible to create the favoured direction of propagation of the acoustic waves.

Advantageously, the surface wave transducer may comprise a succession of at least two etching networks which are asymmetric so as to locally reverse the favoured direction of propagation of the surface waves.

According to another variant of the invention, the networks of electrodes define sets of 3 electrodes of different width per characteristic wavelength corresponding to the central frequency of operation of the transducer in which sets, a first electrode and a second electrode are separated by a distance $3\lambda/16$, and are connected to different polarities, the second electrode and a third electrode being separated by a distance $\lambda/8$, in such a way as to define a favoured direction of propagation of the acoustic waves, the electrodes being positioned on the mesas of the etching network.

The advantage of such a configuration resides in the increase in the reflection coefficients of the electrodes. In conventional structures, to increase these coefficients, it is necessary to increase the thickness of the electrodes; by using a structure of mesas separated by etchings, the electrodes being deposited on the surface of the mesas, the coefficient of reflection of the electrodes is thereby increased whilst maintaining a small thickness of metallization.

BRIEF DESCRIPTION OF THE DRAWINGS

The invention will be better understood and other advantages will become apparent on reading the description which follows given by way of non-limiting example and by virtue of the appended figures in which.

DESCRIPTION OF THE PREFERRED EMBODIMENTS

In general, the surface wave transducer according to the invention comprises the superposition of networks of electrodes and of at least one etching network. Conventionally, the substrates used can be in particular quartz, the electrodes may be obtained by metallization for example using aluminium. The substrates used may again advantageously be of the $LiNbO_3$, $LiTaO_3$ or else $Li_2B_4O_7$ type. Furthermore, etching techniques are highly developed on such quartz type substrates and in particular the so-called ICP (Inductive Coupled Plasma) technique using a high-energy plasma and allowing low-cost mass fabrication of etched devices. It should be noted that the width of the etchings can be different from the width of the mesas and in particular smaller, according to certain variants, the etching width being equal to the electrode width.

According to a first variant of the invention, to obtain a large coupling coefficient conferred by symmetric networks of electrodes, a favoured direction of propagation of the surface waves is created by virtue of the presence of the etching network. We shall describe several possible exemplary layouts for implementing this type of configuration.

Examples of Transducers with 4 Electrodes Per Wavelength $\lambda$

In this type of transducer, the electrodes are distributed symmetrically over the substrate with a period $\lambda/4$. Such a structure exhibits a good coupling coefficient but remains bidirectional. Specifically, the reflections created by the electrodes cancel one another out and no favoured direction of propagation of the acoustic waves is generated with such a configuration. To disturb this bidirectionality, the invention proposes to superimpose an etching network so as to give rise to additional reflections in an asymmetric manner with respect to a central axis C defined between two electrodes connected to different polarities and symbolized in the diagram by a + sign and a − sign, in FIG. 1a.

Figure 1A:
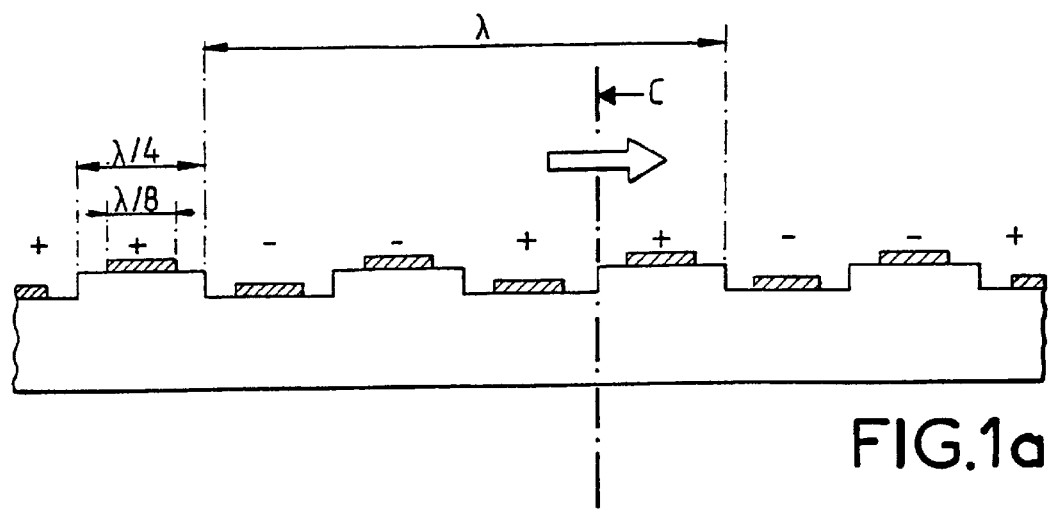
FIG. 1a illustrates a first exemplary transducer according to the invention with 4 electrodes per $\lambda$, exhibiting a favoured direction of propagation of the surface waves.
Figure 1B:
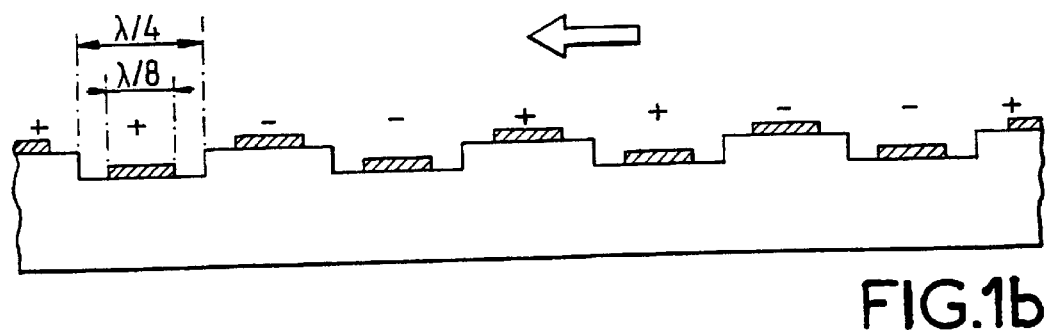
FIG. 1b illustrates a second exemplary transducer according to the invention with 4 electrodes per $\lambda$, exhibiting a favoured direction of propagation of the surface waves which is opposite to that of the first exemplary transducer.

By making the centres of the electrodes coincide with the centres of the mesas or of the etchings, reflections from centre of etching positioned at $\lambda/8$ or $3\lambda/8$, with respect to the centre of an electrode, are obtained if the distance between consecutive mesa and etching is $\lambda/4$. These etching flanks generate the reflections required for obtaining a favoured direction of propagation of the surface acoustic waves. FIG. 1b illustrates a configuration in which the favoured direction of propagation of the acoustic waves is opposite to that of FIG. 1a. In this first variant, the distance between consecutive electrodes may advantageously be equal to the distance between a mesa and a consecutive etching.

Figure 2:
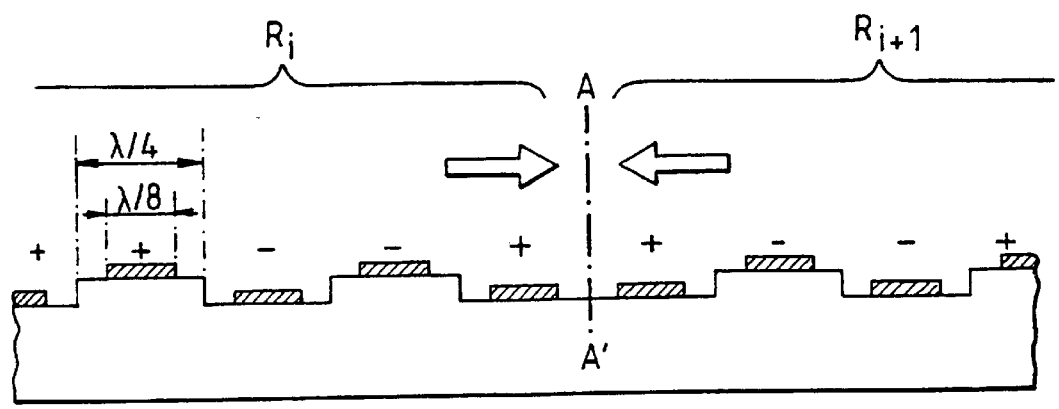
FIG. 2 illustrates a third exemplary transducer according to the invention with 4 electrodes per $\lambda$ comprising locally a first directivity of the surface waves in one sense and locally a second directivity of the surface waves which is opposite to the first.

As has been stated previously, it may be beneficial to create resonant cavities. To make this type of configuration, in which the favoured direction of propagation of the acoustic waves is locally reversed, the transducer according to the invention can comprise a succession of layout according to FIG. 1a and of layout according to FIG. 1b, as illustrated in FIG. 2. In this type of layout at the level of the axis AA', there is a break in the periodicity of the etching network such as to pass continuously from an etching network of first type $R_i$ as represented in FIG. 1a to an etching network of second type $R_{i+1}$, as represented in FIG. 1b.

Such a configuration has the benefit of much easier technology than that conventionally used in this type of transducer for which it is tricky to locally displace the position between a transduction centre and a reflection centre so as to obtain the desired reversal of directivity.

Figure 3:
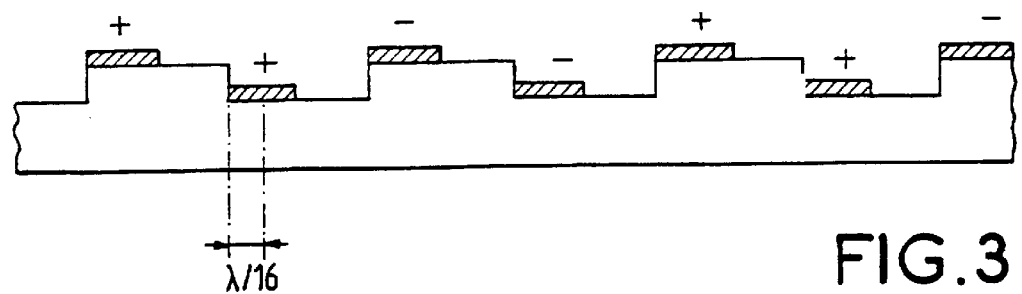
FIG. 3 illustrates a fourth exemplary transducer according to the invention with 4 electrodes per $\lambda$ in which the phase shift between transduction centre and reflection centre is equal to $\lambda/16$.

In the transducer configurations described above with 4 electrodes per wavelength $\lambda$, a transduction centre situated at the centre of an electrode (for example referenced +) is separated from an etching flank corresponding to a centre of reflection by a distance $\lambda/8$, corresponding to the ideal case. In certain applications and in view of the substrates employed, it may be beneficial to create a phase shift which differs from 45° (corresponding to $\lambda/8$). To do this and according to the invention, the etching network can advantageously be shifted with respect to the network of electrodes. FIG. 3 illustrates a configuration in which a transduction centre is a distance of $\lambda/16$ away from an etching flank, i.e. a phase shift of 22.5°. In this configuration, the electrodes are aligned with the flanks of etchings, this possibly representing a technological facility.

Furthermore, in the aforesaid examples, the mesas and etchings exhibit the same widths, however the latter may also advantageously be of a different width.

Figure 4:
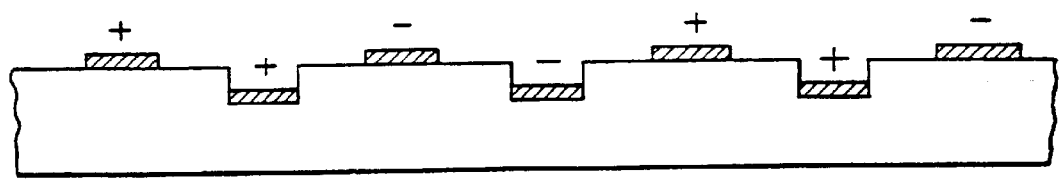
FIG. 4 illustrates a fifth exemplary transducer according to the invention with 4 electrodes per $\lambda$ in which the mesas and the etchings do not possess the same width.

Typically, the etchings can possess a width equal to $\lambda/8$ whilst the mesas possess a width equal to $3\lambda/8$. This allows the etchings to be completely filled with metallization as illustrated by FIG. 4. The production sensitivity may thus be enhanced. Moreover, with this latitude, it becomes very simple to change the width or the position of the etchings locally in the transducer, so as to modify the phase and the amplitude of the reflection coefficient.

Examples of Transducers with Two Electrodes Per Wavelength $\lambda$

The examples described above all relate to transducers of 4 electrodes per $\lambda$, in which the favoured directivity of the surface waves is easily obtained. According to the prior art, the transducers with two electrodes per $\lambda$, illustrated in FIG. 5a, exhibit very high coupling coefficients which are greater than in the transducers with 4 electrodes per $\lambda$ but are not nevertheless bidirectional, the reflections between electrodes being in-phase and being so symmetrically. The superposition of an etching network in this type of transducer advantageously makes it possible to alleviate this drawback. Moreover, this type of transducer has a technological advantage since it makes it possible to fabricate networks of electrodes with a spacing twice as large as the spacing necessary in transducers with 4 electrodes per $\lambda$.

Figure 5A:
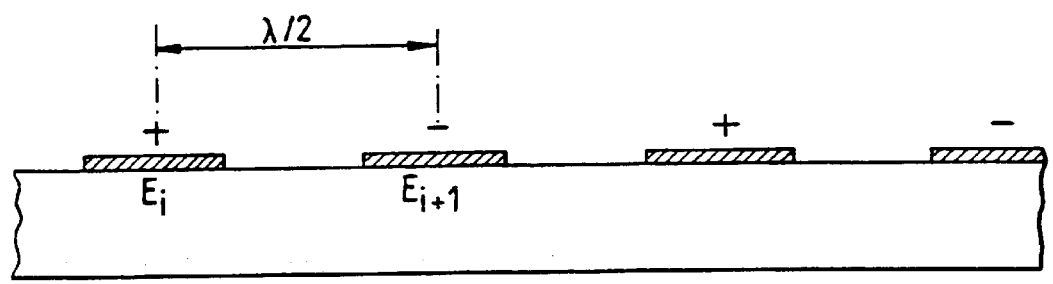
FIG. 5a illustrates a transducer with 2 electrodes per $\lambda$ according to the prior art.
Figure 5B:
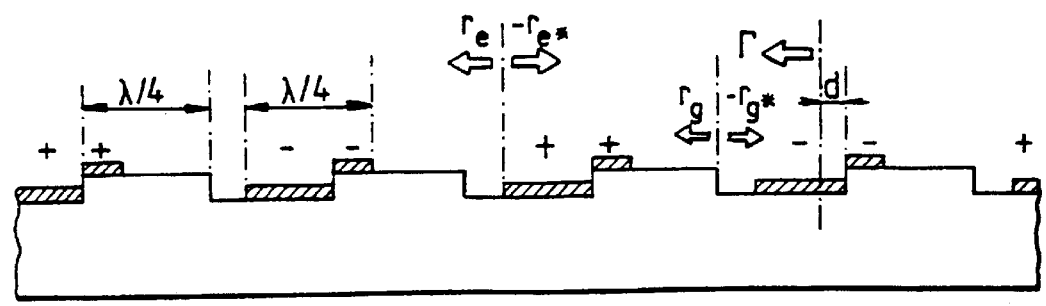
FIG. 5b illustrates a first exemplary transducer according to the invention with 2 electrodes per $\lambda$, in which the electrodes are positioned astride etching flanks, of an etching network of period $\lambda 2/$.

Conventionally, the transducers with 2 electrodes per $\lambda$, comprise electrodes of width $\lambda/4$ separated by a spacing $\lambda/2$, as illustrated in FIG. 5a. The waves emitted at the level of an electrode $E_i$ are in phase with the waves reflected by the consecutive electrode $E_{i+1}$ and vice versa for the waves emitted at $E_{i+1}$ and those reflected by the electrode $E_i$. To disturb this symmetry and the placing in phase of the reflections at the electrodes, the invention proposes to position the electrodes on the etching flanks as illustrated in FIG. 5b.

To comprehend the manner of operation of such a structure and how it is possible to optimize this type of layout, we shall consider the reflection coefficients relating respectively to an etching flank, to an electrode and sited at the centre of the electrode.

In the upward direction etching→mesa, the reflection coefficient is referenced rg.

In the downward direction mesa→etching, the reflection coefficient is referenced −rg*.

In the upward direction substrate→electrode, the reflection coefficient is referenced −re*.

In the downward direction electrode→substrate, the reflection coefficient is referenced re.

If the centre of the electrode is displaced by distance d with respect to the etching flank, the reflection coefficient Γ sited at the centre of the electrode given by the following formula $$\Gamma = r_g \cdot e^{2 \cdot j \cdot k \cdot \left(\frac{\lambda}{4}-d\right)} - \overline{r_g} \cdot e^{-2 \cdot j \cdot k \cdot d} + r_e \cdot e^{2 \cdot j \cdot k \cdot \frac{\lambda}{8}} - \overline{r_e} \cdot e^{-2 \cdot j \cdot k \cdot \frac{\lambda}{8}}$$

$$= -(r_g + \overline{r_g}) \cdot e^{-j \cdot 4 \cdot \pi \cdot \frac{d}{\lambda}} + j \cdot (r_e + \overline{r_e})$$

$$= -2 \cdot \operatorname{Re}(r_g) \cdot e^{-j \cdot 4 \cdot \pi \cdot \frac{d}{\lambda}} + j \cdot 2 \cdot \operatorname{Re}(r_e)$$

To obtain unidirectional transduction, we require the reflection coefficient Γ to be a pure real, thus implying:

$$-2 \cdot \operatorname{Re}(r_g) \cdot e^{-j \cdot 4 \cdot \pi \cdot \frac{d}{\lambda}} + j \cdot 2 \cdot \operatorname{Re}(r_e) = 0 \quad \text{where } Re \text{ real part} \quad (1)$$

$$d = -\frac{\lambda}{4 \cdot \pi} \cdot \operatorname{asin}\left(\frac{\operatorname{Re}(r_e)}{\operatorname{Re}(r_g)}\right)$$

$$\Gamma = -2 \cdot \operatorname{Re}(r_g) \cdot \cos\left(4 \cdot \pi \cdot \frac{d}{\lambda}\right) \quad (2)$$

hence $$\Gamma = -2 \cdot \operatorname{Re}(r_g) \cdot \cos\left(-\operatorname{asin}\left(\frac{\operatorname{Re}(r_e)}{\operatorname{Re}(r_g)}\right)\right)$$

$$\Gamma = -2 \cdot \operatorname{Re}(r_g) \cdot \sqrt{1 - \frac{\operatorname{Re}(r_e)^2}{\operatorname{Re}(r_g)^2}}$$

Equations (1) and (2) impose the condition |Re(re)|<|Re(rg)|, which can always be obtained for a judiciously chosen value of the distance d.

The first exemplary transducer with 2 electrodes per λ, which has just been described nevertheless requires a technology in which the electrodes must be deposited at the intersection of a mesa and an etching, which is not very easy.

This is why, the invention also proposes another configuration of transducer with 2 electrodes per λ, but of more direct technology.

Figure 6A:
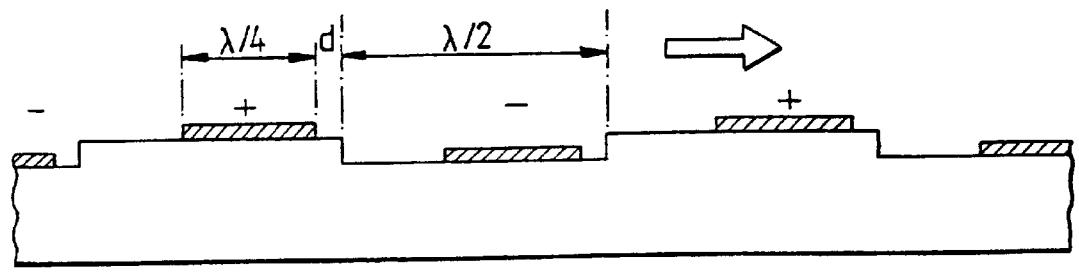
FIGS. 6a and 6b illustrate a second exemplary transducer according to the invention with 2 electrodes per $\lambda$, in which the electrodes are positioned on mesas or etchings of an etching network of period $\lambda$.
Figure 6B:
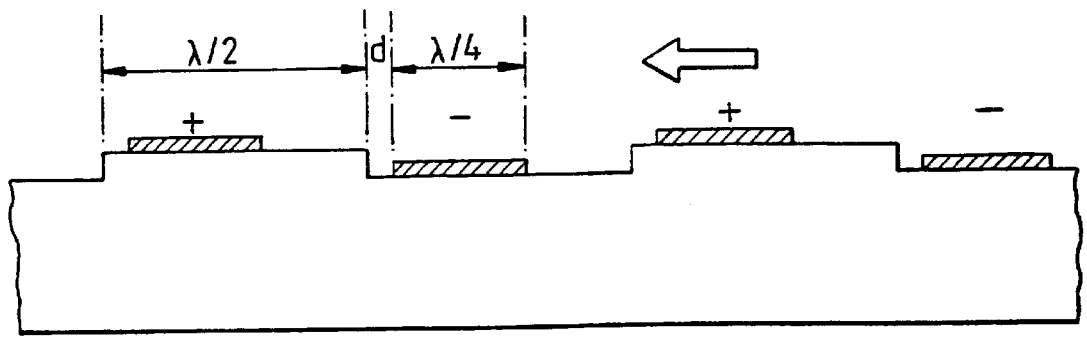

This involves a unidirectional transducer in which the network of 2 electrodes per λ is superimposed on a network of etchings of spacing λ, as illustrated in FIG. 6a or 6b.

This type of transducer operates at the second harmonics. It has the advantage of offering a wider geometry than the geometries described above and is especially advantageous for applications at very high frequencies.

By considering the same parameters rg, re and Γ, we obtain for the central reflection coefficient Γ:

$$\Gamma = r_g \cdot e^{2 \cdot j \cdot k \cdot \left(\frac{3\lambda}{8}-d\right)} - \overline{r_g} \cdot e^{-2 \cdot j \cdot k \cdot \left(\frac{\lambda}{8}+d\right)} + r_e \cdot e^{2 \cdot j \cdot k \cdot \frac{\lambda}{8}} - \overline{r_e} \cdot e^{-2 \cdot j \cdot k \cdot \frac{\lambda}{8}}$$

$$= -j \cdot (r_g - \overline{r_g}) \cdot e^{-j \cdot 4 \cdot \pi \cdot \frac{d}{\lambda}} + j \cdot (r_e + \overline{r_e})$$

$$= 2 \cdot \operatorname{Im}(r_g) \cdot e^{-j \cdot 4 \cdot \pi \cdot \frac{d}{\lambda}} + j \ldots 2 \cdot \operatorname{Re}(r_e)$$

As before, to obtain a favoured direction of propagation, we seek to obtain a pure real reflection coefficient, i.e.:

$$2 \cdot \operatorname{Im}(r_g) \cdot e^{-j \cdot 4 \cdot \pi \cdot \frac{d}{\lambda}} + j \ldots 2 \cdot \operatorname{Re}(r_e) = 0 \quad (3)$$

$$d = \frac{\lambda}{4 \cdot \pi} \cdot \operatorname{asin}\left(\frac{\operatorname{Re}(r_e)}{\operatorname{Im}(r_g)}\right)$$

with Im: imaginary part and $\Gamma = 2 \cdot \operatorname{Im}(r_g) \cdot \cos\left(4 \cdot \pi \cdot \frac{d}{\lambda}\right)$ hence: $\Gamma = 2 \cdot \operatorname{Im}(r_g) \cdot \cos\left(\operatorname{asin}\left(\frac{\operatorname{Re}(r_e)}{\operatorname{Im}(r_g)}\right)\right)$ $$\Gamma = 2 \cdot \operatorname{Im}(r_g) \cdot \sqrt{1 - \frac{\operatorname{Re}(r_e)^2}{\operatorname{Im}(r_g)^2}}$$

As in the previous example, it is possible to determine a value d such that it permits |Re(re)|<|Im(rg)|.

And as in the case of transducers with 4 electrodes per λ, it may be very advantageous to make transducers in which the mesas and the etchings do not have the same width.

Examples of Transducers with 3 Electrodes Per Wavelength λ

Figure 7A:
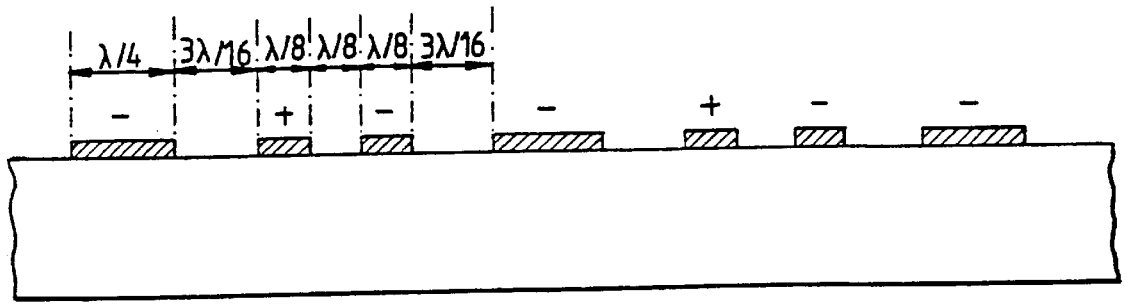
FIG. 7a illustrates an exemplary conventional transducer of the SPUDT type with 3 electrodes per $\lambda$.

According to another variant of the invention, it is possible to use a conventional surface wave transducer of SPUDT type, using an asymmetric network of electrodes and in which the coupling performance is enhanced by virtue of the improvement in the reflection coefficients of the electrodes used for a transducer wavelength. FIG. 7a illustrates a transducer with 3 electrodes per λ, two electrodes are λ/4 apart so as to cancel the sharp reflections of the said electrodes; specifically, a wave emitted by an electrode is in phase opposition with respect to the wave reflected by the consecutive electrode separated by the distance λ/4. The third electrode separated by a distance of 3λ/8 from the consecutive electrode, plays the role of reflector.

Figure 7B:
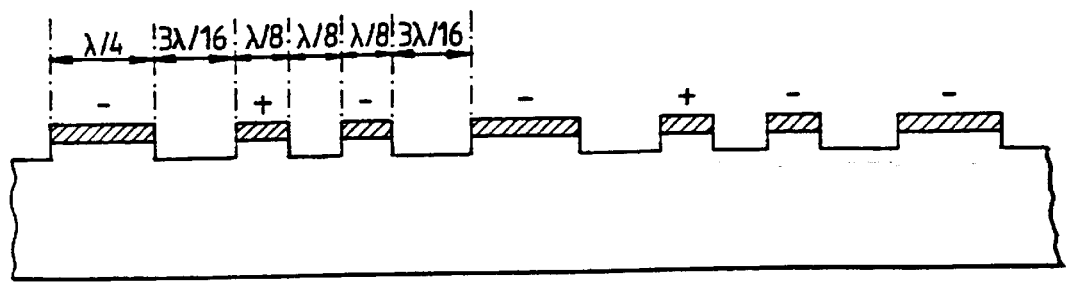
FIG. 7b illustrates an exemplary transducer of the SPUDT type with 3 electrodes per $\lambda$, in which the network of electrodes is superimposed on the etching network.

One way of increasing the reflection coefficient of such a layout consists in increasing the thickness of the said electrodes. In general, beyond a certain value of electrode metallization, the said electrode loses its properties and the technology becomes tricky. This is why the invention proposes a transducer variant in which the coefficients of reflection of the electrodes are improved by increasing the thickness of electrodes without increasing the thickness of metallization as illustrated in FIG. 7b. Such a technology moreover makes it possible to use a single mask for making the etching network and the electrode metallization network.

Figure 7C:
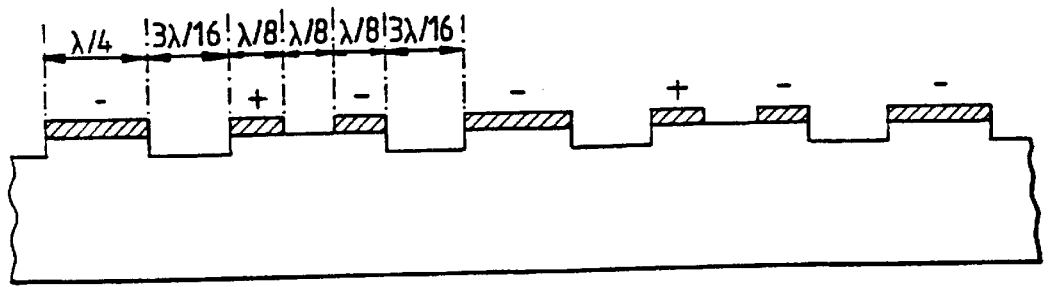
FIG. 7c illustrates a variant of the exemplary unidirectional transducer illustrated in FIG. 7b.

To perfect such a structure, it is beneficial not to etch the substrate uniformly as illustrated in FIG. 7c. Specifically, by not etching at the level of a transduction centre, it is possible to increase the reflectivity spread so as selectively to make certain electrodes into the reflection centre and thus lead to a decrease in transduction length. In particular, by not etching at the level of a transduction centre situated between an electrode referenced + and an electrode referenced −, a surface wave at the level of this transduction centre can be placed in phase with a wave reflected by the electrode making up a reflection centre located at 3λ/8.

What is claimed is:
1. A surface wave transducer comprising:
   a substrate on which are deposited two networks of interdigital electrodes connected to different polarities and configured to create acoustic transduction cells defined by at least two consecutive electrodes of different polarities; and at least one etching network separated by mesas, wherein the superposition of the two networks of interdigital electrodes and the at least one etching network is configured to obtain a favoured direction of propagation of acoustic waves, and wherein the two networks of interdigital electrodes are symmetric with respect to an axis situated at the centre of two consecutive electrodes of the same polarity with respect to said axis.

2. The surface wave transducer according to claim 1, wherein a central axis coincides with an etching flank of the etching network.

3. The surface wave transducer according to claim 1, further comprising a succession of at least two etching networks which are asymmetric and configured to locally reverse the favoured direction of propagation of the acoustic waves.

4. The surface wave transducer according to claim 1, wherein at least one etching network comprises an alternation of etchings and of mesas, a width of the etchings being different from a width of the mesas.

5. The surface wave transducer according to claim 1, wherein a distance between two consecutive electrodes is equal to a distance between a consecutive mesa and etching.

6. The surface wave transducer according to claim 1, wherein a distance between consecutive electrodes is equal to a quarter of a characteristic wavelength corresponding to a central frequency of operation of the transducer, and the two networks of interdigital electrodes comprise pairs of interdigital electrodes.

7. The surface wave transducer according to claim 1, wherein a distance between a consecutive mesa and etching is equal to a quarter of a characteristic wavelength.

8. The surface wave transducer according to claim 5, wherein a width of the electrodes is equal to an eighth of a characteristic wavelength.

9. The surface wave transducer according to claim 1, wherein the two networks of interdigital electrodes define sets of 3 electrodes per characteristic wavelength, in which sets a first electrode and a second electrode are separated by a distance equal to a quarter of a characteristic wavelength, and are connected to different polarities, the second electrode and a third electrode being separated by a distance equal to three-eighths of a characteristic wavelength in such a way as to define a favoured direction of propagation of the acoustic waves, the electrodes being positioned on the mesas of the etching network.

10. The surface wave transducer according to claim 2, wherein a central axis is situated a nonzero distance from an etching flank of the etching network.

11. The surface wave transducer according to claim 2, wherein a distance between two consecutive electrodes is equal to half a characteristic wavelength.

12. The surface wave transducer according to claim 11, wherein a width of the electrodes is of the order of a quarter of a characteristic wavelength.

13. The surface wave transducer according to claim 11, wherein a distance between a consecutive etching and mesa is equal to a quarter of the characteristic wavelength, the electrodes being positioned astride the said mesas and etchings.

14. The surface wave transducer according to claim 11, wherein a distance between a consecutive etching and mesa is equal to the characteristic wavelength.

15. The surface wave transducer according to claim 9, wherein the first and second electrodes of a set of 3 electrodes per wavelength are positioned on one and the same mesa.

* * * * *